US006611007B2

(12) United States Patent
Thompson et al.

(10) Patent No.: US 6,611,007 B2
(45) Date of Patent: Aug. 26, 2003

(54) METHOD FOR LOCALLY MODIFYING THE EFFECTIVE BANDGAP ENERGY IN INDIUM GALLIUM ARSENIDE PHOSPHIDE (INGAASP) QUANTUM WELL STRUCTURES

(75) Inventors: David A. Thompson, Greensville (CA); Brad J. Robinson, Hamilton (CA); Gregory J. Letal, Nepean (CA); Alex S. W. Lee, Dundas (CA)

(73) Assignee: Fiber Optic Systems Technology, Inc., Westchester, PA (US)

( * ) Notice: Subject to any disclaimer, the term of this patent is extended or adjusted under 35 U.S.C. 154(b) by 0 days.

(21) Appl. No.: 10/140,824

(22) Filed: May 9, 2002

(65) Prior Publication Data

US 2002/0127752 A1 Sep. 12, 2002

Related U.S. Application Data

(62) Division of application No. 09/833,078, filed on Apr. 12, 2001.
(60) Provisional application No. 60/205,261, filed on May 19, 2000.

(51) Int. Cl.[7] .......................................... H01L 31/0328
(52) U.S. Cl. ...................... 257/184; 257/186; 257/194; 257/201; 257/209; 257/464; 257/929
(58) Field of Search ................................ 257/184, 186, 257/189, 192, 194, 199, 201, 209, 292, 295, 438, 439, 461, 464, 509, 549, 927, 929; 372/45, 50, 92, 101

(56) References Cited

U.S. PATENT DOCUMENTS

| 4,805,179 A | 2/1989 | Harder et al. |
| 4,871,690 A | 10/1989 | Holonyak, Jr. et al. |
| 5,298,454 A | 3/1994 | D'Asaro et al. |
| 5,353,295 A | 10/1994 | Holonyak, Jr. et al. |
| 5,395,793 A | 3/1995 | Charbonneau et al. |
| 5,425,043 A | 6/1995 | Holonyak, Jr. et al. |
| 5,455,429 A | 10/1995 | Paoli et al. |
| 5,539,763 A | 7/1996 | Takemi et al. |
| 5,574,745 A | 11/1996 | Paoli et al. |
| 5,608,753 A | 3/1997 | Paoli et al. |
| 5,671,242 A * | 9/1997 | Takiguchi et al. ............ 372/45 |
| 5,707,890 A | 1/1998 | Emery et al. |
| 5,708,674 A | 1/1998 | Beernink et al. |
| 5,766,981 A | 6/1998 | Thornton et al. |
| 5,771,256 A | 6/1998 | Bhat |
| 5,843,802 A | 12/1998 | Beernink et al. |
| 5,882,951 A | 3/1999 | Bhat |
| 5,915,165 A | 6/1999 | Sun et al. |
| 6,027,989 A | 2/2000 | Poole et al. |
| 6,459,716 B1 * | 10/2002 | Lo et al. ........................ 372/50 |

OTHER PUBLICATIONS

G.J. Letal, D.A. Thompson, B.J. Robinson, J.G. Simmons, (2001), "Demonstration of a DFB laser with an integrated electro–absorption modulator produced using a novel quantum–well intermixing technique", Materials Science and Engineering, B80, pp. 232–235.

A.S.W. Lee, D.A. Thompson, B.J. Robinson, (2000), "Enhanced bandgap blue–shift in InGaAsp multiple–quantum–well laser structures by low–temperature–grown InP", Semicond. Sci. Technol., 15, L41–43.

(List continued on next page.)

Primary Examiner—Long Pham
Assistant Examiner—Wai-Sing Louie
(74) Attorney, Agent, or Firm—Blank Rome, LLP

(57) ABSTRACT

A novel quantum well intermixing method for regionally modifying the bandgap properties of InGaAsP quantum well structures is disclosed. The method induces bandgap wavelength blue shifting and deep states for reducing carrier lifetime within InGaAsP quantum well structures. The novel quantum well intermixing technique is applied to the modulator section of an integrated DFB laser/electro-absorption modulator, wherein the modulator exhibits fast switching times with efficient optical coupling between the DFB laser and modulator region.

17 Claims, 5 Drawing Sheets

OTHER PUBLICATIONS

A.S.W. Lee, M. Mackenzie, D.A. Thompson, J. Bursik, B.J. Robinson, and G.C. Weatherly, (2001), "Enhanced bandgap blueshift due to group V intermixing in InGaAsP multiple quantum well laser structures induced by low temperature grown InP", Applied Physics Letters, vol. 78, No. 21, pp. 3199–3201.

T. Yin, G.J. Letal, B.J. Robinson, D.A. Thompson, (2001), "The Effects of InP Grown by He–Plasma Assisted Epitaxy on Quantum Well Intermixing", Journal of Quantum Electronics, vol. 37, pp. 426–429.

D.A. Thompson, J.F. Hazell, A.S.W. Lee, T. Yin, G.J. Letal, B.J. Robinson, N. Bertsch and J.G. Simmons, (2000), "New methods of defect–enhanced quantum well intermixing and demonstrated integrated distributed feedback laser–modulator", Proc. Spie, 4078, pp. 148–162.

J.E. Haysom, P.J. Poole, R.L. Williams, S. Raymond, G.C. Ayers, (2000), "Diffusion of defects in InP studied using quantum well intermixing", Solid State Communications SSC5429, pp. 1–4.

J.E. Haysom, P.J. Poole, G.C. Ayers, S.J. Rolfe, S. Raymond, I.V. Mitchell, S. Charbonneau, (2000), "Quantum Well Intermixing Caused By Non–Stoichiometric INP", IPRM 2000—InP and Related Materials Conference, May 14–18, pp. 56–59.

H. Pinkney, D.A. Thompson, B.J. Robinson, L. Qian, S.D. Benjamin, P.W.E. Smith, (2000), "Growth of novel InP–based materials by He–plasma–assisted epitaxy", Journal of Crystal Growth, 209, pp. 237–241.

L. Qian, S.D. Benjamin, P.W.E. Smith, B.J. Robinson, D.A. Thompson, (1997), "Picosecond carrier lifetime and large optical nonlinearities in InGaAsP grown by He–plasma–assisted molecular beam epitaxy" Optics Letters, vol. 22, No. 2, pp. 108–110.

J.U. Kang, M.Y. Frankel, R.D. Esman, D.A. Thompson, B.J. Robinson, (1998), "InGaAsP grown by He–plasma–assisted molecular beam epitaxy for 1.55 µm high speed photodetectors", Applied Physics Letters, vol. 72, No. 11, pp. 1278–1280.

L. Qian, S.D. Benjamin, P.W.E. Smith, B.J. Robinson, and D.A. Thompson, (1997), "Subpicosecond carrier lifetime in beryllium–doped InGaAsP grown by He–plasma–assisted molecular beam epitaxy", Applied Physics Letters 71(11), pp. 1513–1515.

J.U. Kang, M.Y. Frankel, R.D. Esman, D.A. Thompson, B.J. Robinson, (1998), "Dependence of carrier lifetime and resistivity on annealing in InP grown by He–plasma–assisted molecular beam epitaxy", Journal of Applied Physics, vol. 83, No. 6, pp. 3423–3425.

L. Qian, P.W.E. Smith, M.A. Matin, H. Pinkney, B.J. Robinson, and D.A. Thompson, (2000), "Ultrafast carrier dynamics in InGaAsP grown by He–plasma–assisted epitaxy", Optics Communtications, vol. 185, pp. 487–492.

L. Qian, P.W.E. Smith, B.J. Robinson, D.A. Thompson, (2001), "An ultrafast all–optical asymmetric Fabry–Perot switch based on bulk Be–doped InGaAsP grown by He–plasma–assisted epitaxy", Opt. Quantum Electron. Special Issue on Components for Ultrafast Communications.

H. Pinkney, D.A. Thompson, B.J. Robinson, P. Mascher, P.J. Simpson, U. Myler, J.U. Kang and M.Y. Frankel, (1998), "Characterization of annealed high–resistivity InP grown by He–plasma–assisted epitaxy", J. Vac. Sci. Technology A 16(2), pp. 772–775.

H. Pinkney, D.A. Thompson, B.J. Robinson, P.J. Simpson, U. Myler, R.W. Streater, (1999), "Characterization of He–Plasma–Assisted GSMBE InGaAsP", IEEE Publication 99CH36362, pp. 143–146.

L. Qian, S.D. Benjamin, P.W.E. Smith, B.J. Robinson, D.A. Thompson, (1999), "Dual–wavelength pump probe measurements on helium–plasma–grown InGaAsP reveal complex carrier dynamics", Conf. On Lasers & Electrophysics, CLEO '99.

D.B. Mitchell, B.J. Robinson, D.A. Thompson, L. Qian, S.D. Benjamin, P.W.E. Smith, (1996), "He–plasma assisted epitaxy for highly resistive, optically fast InP–based materials", Appl. Phys. Lett. 69 (4), pp. 509–511.

J.S. Tsang, C.P. Lee, S.H. Lee, K.L. Tsai, C.M. Tsai and J.C. Fan; "Compositional Disordering of InGaAs/GaAs heterostructures by low–temperature–grown GaAs Layers", J. Appl. Phys., 79(2), pp. 664–670.

Journal of Crystal Growth (2000), "Growth of novel InP–based materials by He–plasma–assisted epitaxy," Authors: Pinkney et al.; pp. 237–241.

J. Vac. Sci. Technol. A 16(2), Mar./Apr. 1998, "Characterization of annealed high–resistivity InP grown by He–plasma–assisted epitaxy," Authors: Pinkney et al.; pp. 772–775.

J. Vac. Sci. Technol. A 16(2), Mar./Apr. 1998, "Quantum well intermixing in material systems for 1.5 µm (invited)," Authors: Marsh et al.; pp. 810–816.

IEEE Photonics Technology Letters, vol. 8, No. 9, Sep. 1996, "10 Gb/s Wavelength Conversion with Integrated Multiquantum–Well–Based 3–Port Mach–Zehnder Interferometer," Authors: Idler et al.; pp. 1163–1165.

J. Appl. Phys. 79(2), Jan. 15, 1996, "Compositional disordering of InGaAs/GaAs heterostructures by low–temperature–grown GaAs layers," Authors: Tsang et al.; pp. 664–670.

IEEE Photonics Technology Letters, vol. 7, No. 9, Sep. 1995, "Monolithic Integration of InGaAsP–InP Stratined–Layer Distributed Feedback Laser and External Modulator by Selective Quantum–Well Interdiffusion," Authors: Ramdane et al.; pp. 1016–1018.

"Quantum Well Intermixing Caused By Non–Stoichiometric INP," Authors: Haysom et al.; pp. 56–59.

\* cited by examiner

METHOD FOR LOCALLY MODIFYING THE EFFECTIVE BANDGAP ENERGY IN INDIUM GALLIUM ARSENIDE PHOSPHIDE (INGAASP) QUANTUM WELL STRUCTURES

REFERENCE TO RELATED APPLICATIONS

The present application is a division of U.S. patent application Ser. No. 09/833,078, filed Apr. 12, 2001, currently pending, which claims the benefit of U.S. Provisional Application No. 60/205,261 filed May 19, 2000.

FIELD OF THE INVENTION

This invention relates to quantum well devices and to a method of changing and/or controlling the effective bandgap energy in quantum well structures, particularly Indium Gallium Arsenide Phosphide (InGaAsP) devices or structures. More particularly, it is concerned with enabling the integration of multiple optoelectronic devices within a single structure, each comprising a quantum well structure.

BACKGROUND OF THE INVENTION

The semiconductor industry is currently interested in integrating various optoelectronic devices, such as lasers, modulators and detectors within a single semiconductor structure. This initiative is motivated by the increasing demand for optoelectronic technology particularly in the optical telecommunications field.

Integrated optoelectronic devices are of great interest due to the optical alignment and optical coupling efficiency challenges associated with using discrete optoelectronic devices. Within an integrated optoelectronic device, each optical component is spatially self aligned as result of being fabricated within the same semiconductor structure. This inherently gives better transmission between the components of an integrated device, as compared to putting together discrete devices. However, in order to ensure that the separate optical components within the structure each has its own independent characteristics, local modifications to the semiconductor quantum well structure of each component are usually necessary. Many known fabrication techniques for one component of an integrated structure tend to have the unwanted effect of distorting or affecting properties of neighbouring components.

Quantum Well Intermixing (QWI) is a Post-growth method of bandgap engineering known in the art, enabling controlled changes in the bandgap energy of selected regions of the quantum well structure. Quantum Well Intermixing uses a Rapid Thermal Annealing (RTA) process also known in the art, to provide controlled diffusion of defects into the quantum well structure of an optoelectronic device. These defects are usually provided by a layer or layers of specially grown material that are grown above the quantum well structure. Under the influence of the RTA process, the defects diffuse down into the quantum well structure and introduce changes to the bandgap properties. QWI has attracted considerable interest in locally modifying the quantum well band structure of integrated optoelectronic devices, including tunable wavelength lasers, photodetectors, and modulators. It is believed to be capable of modifying one component with minimum impact on neighbouring components.

Different thermally-driven quantum well intermixing techniques such as Ion-Implantation Disordering (IID), Impurity Free Defect Diffusion (IFDD), Photo-absorption Induced Disordering (PAID) and Impurity-Induced Layer Disordering (IILD) have been utilized in order to modify the quantum well structure in selected regions.

In Ion Implantation Disordering (IID), high energy implanted ions may introduce lattice damage to the quantum well structure, resulting in reduced light output. The Impurity-Induced Layer Disordering (IILD) technique requires long anneal times and/or high anneal temperatures (>800° C.) for diffusing impurities into the quantum well region. This can cause undesirable changes in the characteristics of neighbouring components within an integrated optoelectronic devices. It also introduces unwanted impurities, causing undesirable changes to the properties of the quantum well structure. The Impurity Free Defect Diffusion (IFDD) technique is free of impurities, but control of the QWI process depends on the deposited cap layer being used, it's deposition conditions and the subsequent thermal anneal treatment. If for example, a silicon dioxide ($SiO_2$) cap layer is used, the thermal anneal process requires the use of temperatures between 750–800° C. These anneal temperatures may cause an uncontrollable shift in device operating wavelength, such as, the emission wavelength of laser devices. Also, the surface of the grown material may become unstable and therefore unsuitable for subsequent processing of components such as gratings. Furthermore, strain and damage may be introduced to the hetero-structure surface. Finally, Photo-absorption Induced Disordering (PAID) suffers from poor spatial resolution. Consequently, it is difficult to confine this effect to an intended component within an integrated device, without affecting adjacent components.

Accordingly, there is need for a QWI process wherein, surface contamination, uniformity and strain effects are avoided, and which is reproducible. With these characteristics, it should be possible to import desired properties to one component of an integrated structure, without affecting neighbouring components. Furthermore, there is a need for a QWI process that enables the high speed operation of optoelectronic devices, and affects the photoluminescent properties of the quantum well structure.

SUMMARY OF THE INVENTION

The present invention discloses a Quantum Well Intermixing (QWI) method for locally modifying the effective bandgap energy in Indium Gallium Arsenide Phosphide (InGaAsP) quantum well structures. This quantum well intermixing method involves growth of a first Indium Phosphide layer with slow diffusing defects grown near the upper quaternary layers of the quantum well structure at normal temperature using Gas Source Molecular Beam Epitaxy (GSMBE). A second Indium Phosphide layer with fast diffusing defects is also grown near the surface of the quantum well structure at normal temperature using Gas Source Molecular Beam Epitaxy (GSMBE). By applying a rapid thermal annealing (RTA) process, both the slow diffusing defects from the first Indium Phosphide layer, and fast diffusing defects from the second Indium Phosphide layer, diffuse to the quantum well active region. This controlled inter-diffusion process provides localised, controlled changes in the properties and bandgap energy of the quantum well active region.

An alternative embodiment to the present invention includes a quantum well intermixing process, wherein an Indium phosphide layer with point defects is grown near the surface of the quantum well structure at low temperature using Gas Source Molecular Beam Epitaxy. By applying rapid thermal annealing (RTA), the point defects in the Indium Phosphide layer diffuse to the quantum well region.

This controlled inter-diffusion process provides an increasingly high effect on the effective bandgap energy of the quantum well active region.

In another aspect of the present invention, quantum well intermixing is used in order to modify the effective bandgap properties of an integrated optoelectronic device comprising a laser and electro-absorption modulator. The quantum well intermixing process is applied to the electro-absorption modulator region of the integrated optoelectronic device. Following the quantum well intermixing process, the effective bandgap properties of the Indium Gallium Arsenide Phosphide (InGaAsP) quantum well active region of the modulator are modified. These modifications introduce both an ultra-fast response, and increased efficiency in the operating characteristics of the electro-absorption modulator. This enables the integration of high speed quantum well devices with standard quantum well devices.

DETAILED DESCRIPTION OF THE DRAWINGS

For a better understanding of the present invention and to show more clearly how it may be carried into effect, reference will be made by way of example to the accompanying drawings, in which.

DETAILED DESCRIPTION OF THE PREFERRED EMBODIMENT

A quantum well intermixing method is described, wherein the effective bandgap properties of Indium Gallium Arsenide Phosphide (InGaAsP) quantum well structures are modified in order to enable fabrication of high-speed integrated optoelectronic devices. InGaAsP structures operate at emission wavelengths in the region of 1.55 μm and 1.3 μm, and are particularly used in optoelectronic devices applicable to optical fibre telecommunications. The described method includes process steps based on Gas Source Molecular Beam Epitaxy (GSMBE), patterning/etching and rapid thermal annealing (RTA), for achieving Quantum Well Intermixing (QWI) in the active region of InGaAsP quantum well structures. It should be appreciated that the GSMBE and RTA processes are known to someone skilled in the art, and are therefore not described in detail.

Figure 1:
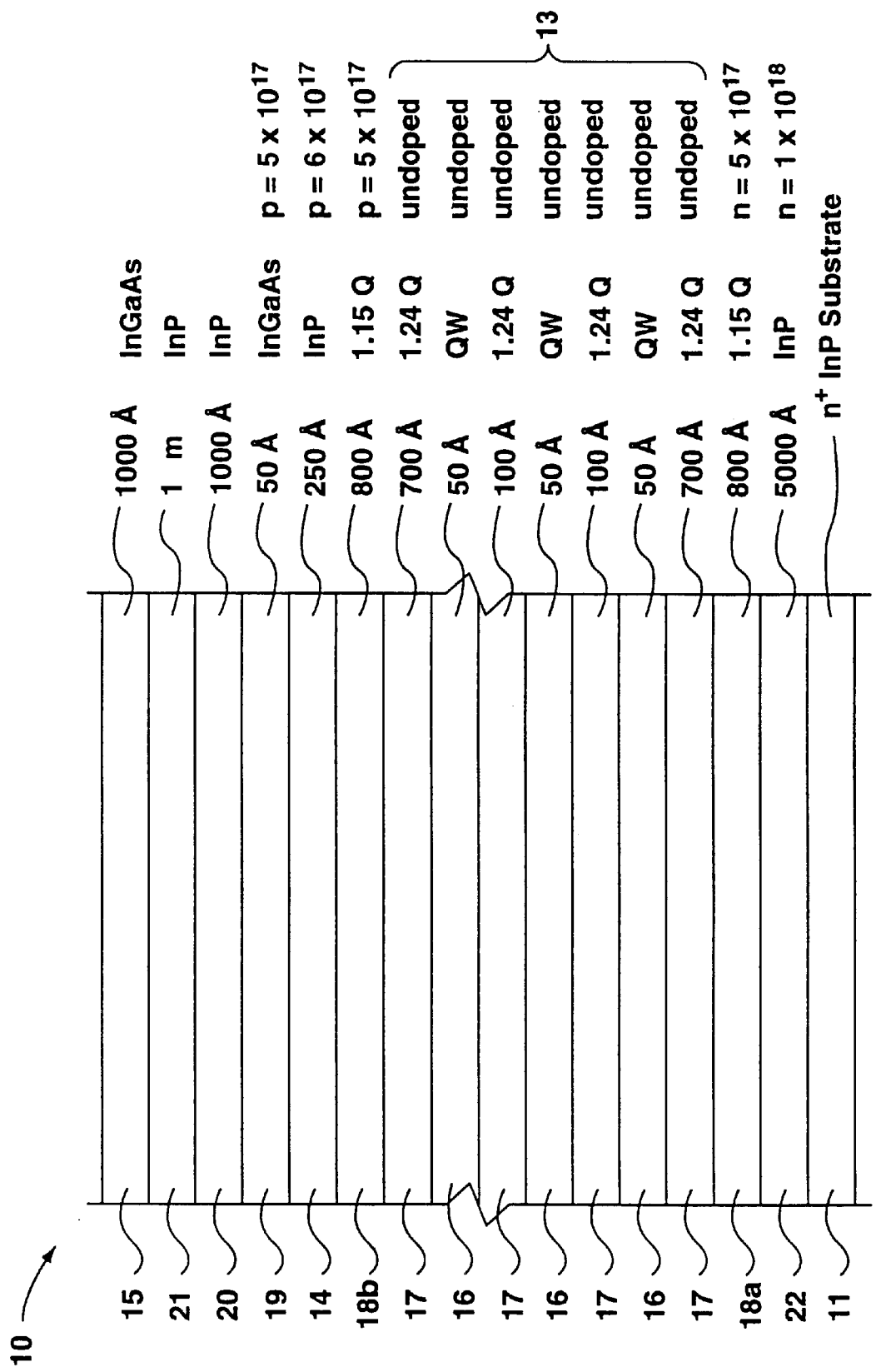
FIG. 1 shows in table form the quantum well structure of an Indium Gallium Arsenide Phosphide (InGaAsP) laser device.

FIG. 1 shows an InGaAsP multiple quantum well structure 10 of a laser device. The structure 10 is grown by GSMBE in sequential layers starting from a 5000 Angstrom InP Buffer layer 22 which itself is formed on an n+InP substrate 11. The next layer grown on top of the InP buffer layer 22 is an 800 Angstrom 1.15Q guiding layer 18a. The following layers grown above the guiding layer 18a, form a conventional quantum well active region 13, which comprises three quantum well layers 16 and four 1.24Q quaternary layers 17. The 1.24Q quaternary layers 17 provide barrier regions of higher bandgap energy between the quantum well layers 16. Optical emissions are generated within this quantum well active region 13. A second 1.15Q guiding layer 18b is grown on top of the last quaternary layer 17. Optical emission generated in the active region 13 is confined between the guiding layers 18a, 18b in order to concentrate the optical output emission from the laser device. A 250 Angstrom InP grating layer 14 is grown above the second 1.15Q guiding layer 18b and used for etching a grating for a Distributed Feed-Back (DFB) laser. A 50 Angstrom InGaAs layer 19 grown above the InP grating layer 14 is used as an etch stop layer. This layer stops the underlying layers (i.e. InP grating layer 14 and quantum well region layers 13) from being etched away during the removal of the InP defect layer 20, once the RTA process is complete. The InGaAs layer 19 also preserves the InP grating layer 14 from atmospheric contamination prior to etching the grating. A 1000 Angstrom InP defect layer 20 is grown above the InGaAs layer 19 for the quantum well intermixing process. These defects have been postulated to be donor-like Phosphor-antisites or acceptor-like Indium-Vacancies. During the RTA process, defects in the InP defect layer 20 diffuse into the quantum well region 13. On completion of the photolithographic/etching and the RTA process, the defect layer 20 is etched away and a thick 1 μm layer of InP 21 is grown in its place. A 1000 Angstrom InGaAs contact layer 15 is grown over the 1 μm InP layer 21. The InGaAs layer 15 is a contact layer for applying current to the device. The 1 μm layer of InP 21 is normally etched into a ridge structure for confining and guiding the applied device current from the InGaAs contact layer 15 to a narrow region of the quantum well active region 13. The 1 μm InP layer 21 and the InGaAs contact layer 15 are grown after the RTA process, once the quantum well active region structure 13 has been grown. All layers with the exception of the InP defect layer 20 are typically used in optoelectronic device fabrication. Once the InP defect layer 20 has been used in the quantum well intermixing process in accordance with the present invention, it is removed from the device structure 10.

The layers of the quantum well structure 10 are grown by GSMBE at a rate of 1 μm/hr on a n-type InP substrate 11. Group V constituent atoms are supplied in the form of $As_2$ and $P_2$ derived from the pyrolysis of $AsH_3$ and $PH_3$ in a single, two zone low pressure cracker with a Ta catalyst operating at 1000° C. All layers except the InP defect layer 20 are grown at 470° C. with the group V total flow rate of 4 or 5 sccm. The InP defect layer 20 is grown at a low temperature(LT) of 300° C. and is referred to as LT-InP. Rapid thermal annealing (RTA) is carried out under a flowing nitrogen ambient, using a halogen lamp rapid thermal annealing system.

In accordance with the present invention, during the RTA process, point defects in the LT-InP defect layer 20 diffuse into the active region 13 of the quantum well structure 10 and modify its composite structure. This controlled inter-diffusion process causes a large increase in the bandgap energy of the quantum well active region 13. This is referred to as a wavelength blue shift. Applying wavelength blue shift to a selected region of the quantum well active region 13, increases its transparency, without the need for external biasing. This is due the quantum well bandgap increase which has a higher energy than the generated incident photons. Therefore, the generated photons pass through the transparent quantum well region without being absorbed by electron/hole pairs.

Figure 2:
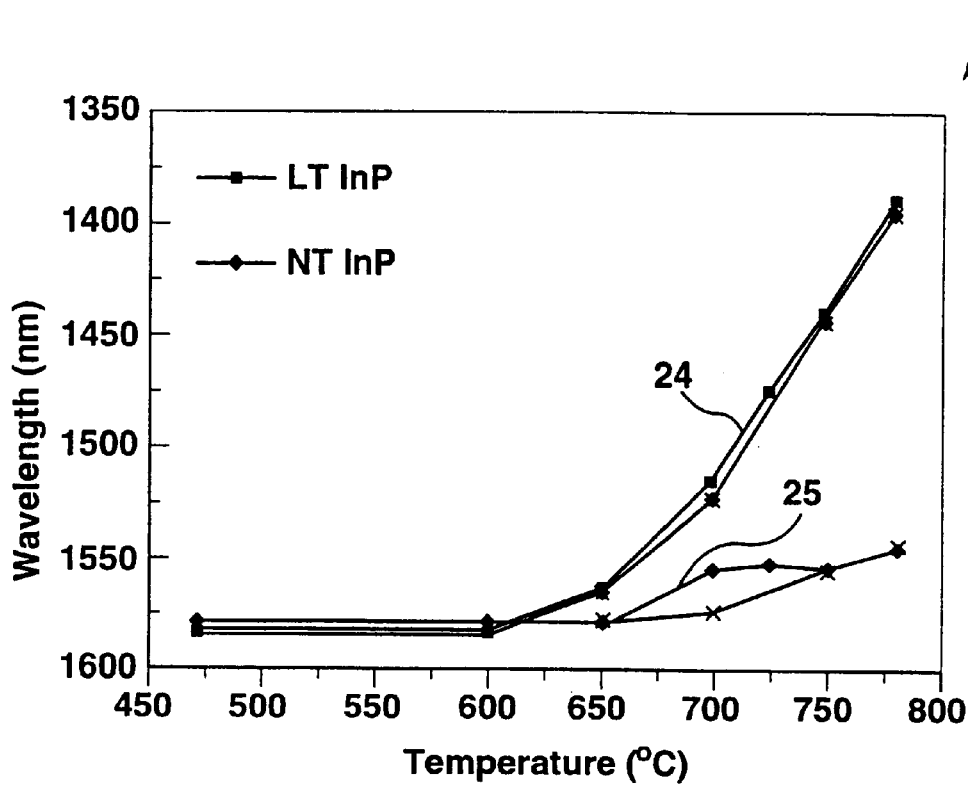
FIG. 2 shows the results of photoluminescence (PL) measurements for both LT and NT grown InP cap layers, annealed for 30 seconds as a function of temperature.

FIG. 2 shows experimental results of photoluminescence (PL) measurements 23 for both Low Temperature (LT) grown InP layer as indicated at 24 and Normal Temperature (NT) grown InP layer as indicated at 25, annealed at various temperatures in the range 600–780° C. for 30 seconds. The Low Temperature (LT) and Normal Temperature (NT) grown InP defect layers are referred to as LT-InP and NT-InP respectively. The LT-InP defect layer is grown at 300° C., whereas the NT-InP layer is grown at 470° C. Quantum well intermixing is carried out on a NT grown InP defect layer in order to compare the magnitude of wavelength blue shift to that of quantum well intermixed LT grown InP defect layer. The quantum well emission wavelength is determined by room temperature photoluminescence (PL) measurements. The graph 23 shows the changes in quantum well emission wavelength (nm) as the anneal temperature (° C.) is increased. Results are shown for both LT (low temperature) and NT (normal temperature) grown InP layers annealed at various temperatures in the range 600–780° C. for 30 seconds. A considerably larger wavelength blue shift (bandgap energy increase) is achieved for the LT-InP layer, as indicated at 24. At the upper end of the anneal temperature range, at 780° C., a large wavelength shift of ≈197 nm is induced by the LT-InP layer as shown at the end of the curve 24, whereas only an ≈35 nm blue-shift is observed for the NT-InP layer, indicated at 25. The abundance of point defects found in the LT grown InP defect layer causes the large wavelength blue shift, wherein the point defects have been postulated to be donor-like P-antisites or acceptor-like In-vacancies.

Figure 3:
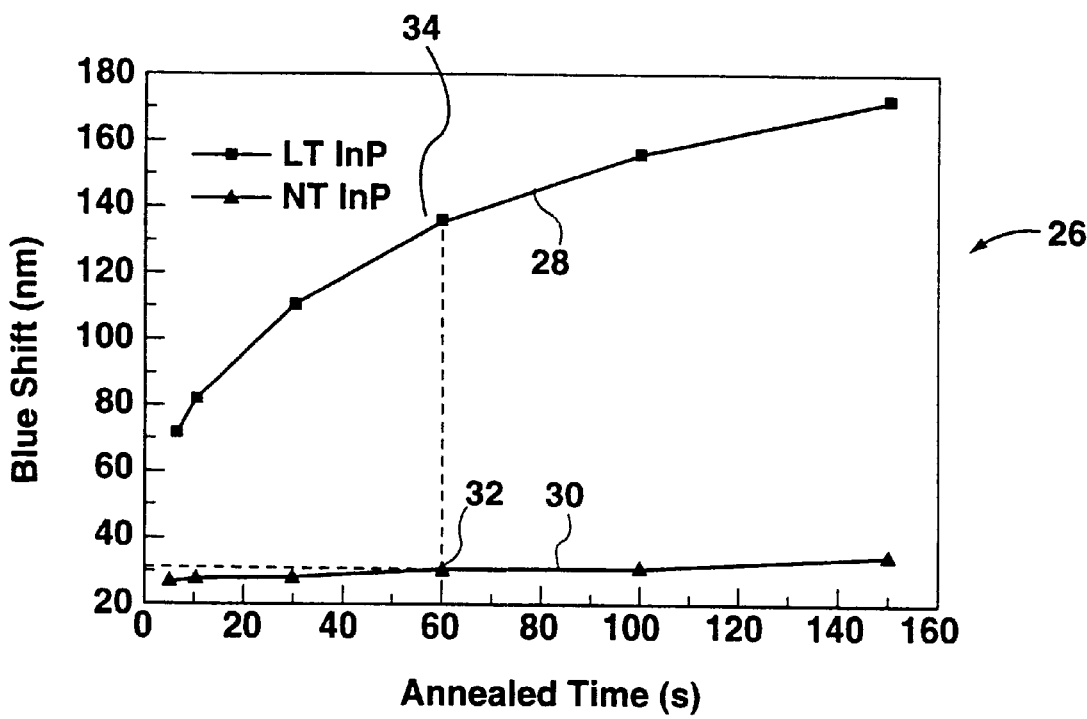
FIG. 3 shows the result of photoluminescence (PL) measurements for both the LT grown InP layer and the NT grown InP layer, annealed at 725° C. as a function of time.

FIG. 3 shows the result of photoluminescence (PL) measurements 26 for both the LT grown InP layer, indicated at 28, and NT grown InP layer, indicated at 30, annealed at 725° C. and shown as a function of time. As indicated by the lines 28, 30, both LT grown and NT grown InP defect layers exhibit initial large blue shifts for anneals of only 5 seconds. However, the LT grown InP defect layer, as indicated at 28 gives an ≈71 nm blue shift which is more than double that of the NT grown InP defect layer, indicated at 30. For a longer anneal time of 60 seconds, the LT grown InP defect layer, indicated at 28, exhibits an ≈132 nm blue shift, indicated at 34, whereas after 60 seconds the NT grown InP defect layer, indicated at 30, exhibits ≈33 nm of blue shift, as indicated at 32, in the emission wavelength of the quantum well active region.

Figure 4:
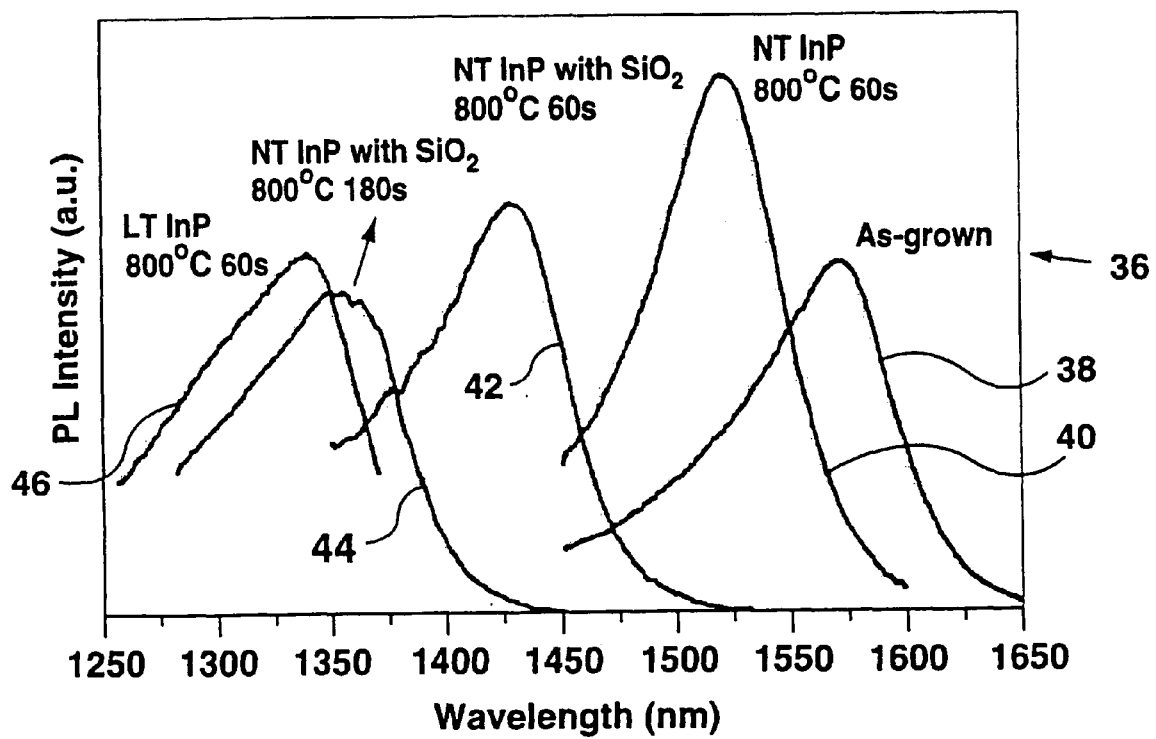
FIG. 4 shows the result of photoluminescence (PL) measurements for both the LT grown InP layer and the NT grown InP layer, annealed at 800° C., with and without a $SiO_2$ cap layer.

FIG. 4 shows the photoluminescence spectra 36 of both the LT grown InP layer, indicated at 46, and NT grown InP layer, indicated at 40, 42, 44, annealed at 800° C. For comparison and reference purposes, the spectrum of the quantum well structure as grown and without any quantum well intermixing is shown at 38. The photoluminescence spectra show the NT grown InP layer which is initially annealed for 60 seconds, as indicated at 40. This NT grown InP layer exhibits ≈57 nm of blue shift in the emission wavelength spectrum, compared to the emission wavelength spectrum shown at 38. Once the NT grown InP layer is capped with a SiO$_2$ layer (IFDD method) and annealed for 60 seconds, the resulting spectrum, indicated at 42, shows an ≈142 nm blue shift in the emission wavelength spectrum, compared to the emission wavelength spectrum, as indicated at 38 of the quantum well region with no quantum well intermixing applied. The most significant blue shift is exhibited by the LT grown InP layer with no SiO$_2$ capping and annealing time of 60 seconds. The corresponding spectrum 46 shows an ≈230 nm blue shift in the emission wavelength spectrum compared to the emission wavelength spectrum, as indicated by 38. Following 180 seconds of anneal time the NT grown InP layer capped with a SiO$_2$ layer exhibits an ≈214 nm blue shift in the emission wavelength spectrum, as indicated at 44, again compared to the emission wavelength spectrum, as indicated at 38. The results show that even with three times the anneal time (180 seconds) an SiO$_2$ capped NT grown InP layer does not exhibit as much bandgap blue shift as that of an LT grown InP layer.

The LT grown InP layer exhibits a large bandgap wavelength blue shift in the InGaAsP quantum well region, for relatively short anneal times and lowered anneal temperatures. This is due to the abundance of point defects in the LT grown InP layer. Producing high wavelength blue shift at lower temperatures avoids undesirable effects during growth of integrated optoelectronic devices. For example, an undesirable shift in the emission wavelength of the laser section of an integrated Distributed Feed-Back (DFB) laser/electro-absorption modulator device will occur as a result high temperature anneals.

It will be appreciated that the thickness of the grown InP layer 20 can be varied in order to generate bandgap energy blue shifts over a range of 0–140 nm in a single thermal anneal.

Devices that have been grown by MOCVD (molecular chemical vapour deposition) methods can also be bandgap shifted using the low temperature GSMBE grown InP layer and the RTA process.

In an alternative embodiment of the present invention, two defect types are grown for the quantum well intermixing process. Both defect types are grown as individual layers on top of the quantum well active region structure, and diffuse into the quantum well active region following a rapid thermal annealing (RTA) process. One of the diffused defect types generates a bandgap wavelength blue shift in the quantum well active region, resulting in the transparency of this region. The other diffused defect type decreases carrier lifetime in the quantum well active region. This reduction in carrier lifetime enables the InGaAsP quantum well active region to exhibit an ultra high speed response, which is particularly suitable for enabling high speed integrated optoelectronic device fabrication. The following paragraphs describe the growth process and properties of these defect types in more detail.

Figure 5A:
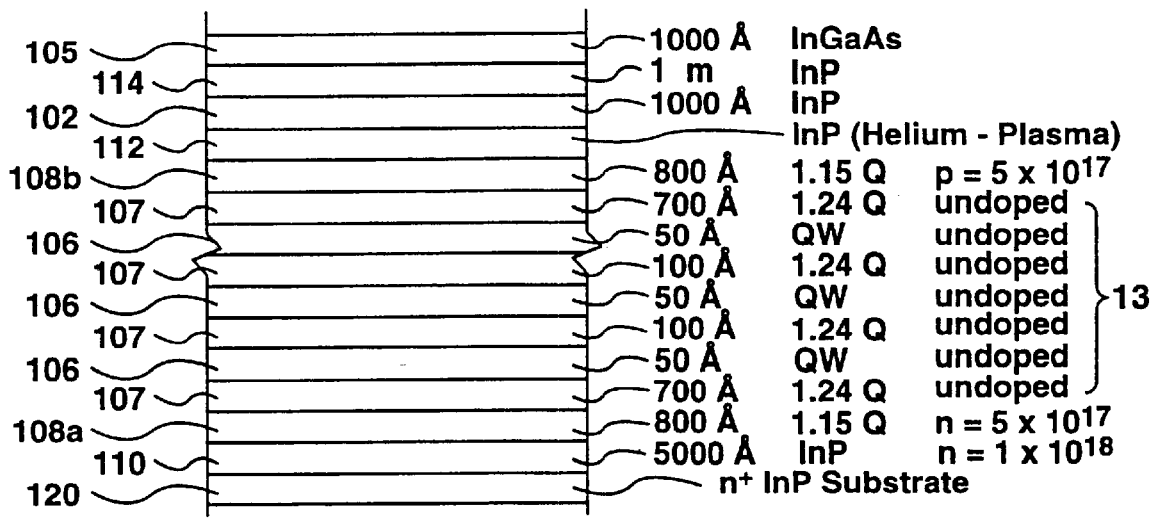
FIG. 5a shows in table form the quantum well structure of an Indium Gallium Arsenide Phosphide (InGaAsP) integrated DFB laser/electro-absorption modulator device.

Referring to FIG. 5a, the InGaAsP quantum well structure is grown on a 5000 Angstrom InP buffer layer 110 which itself is formed on an n+ InP substrate 120. The next layer grown on top of the InP buffer layer 110 is an 800 Angstrom 1.15Q guiding layer 108a. The following layers grown above the guiding layer 108a, form a conventional quantum well active region 103, which comprises three quantum well layers 106 and four 1.24Q quaternary layers 107. The 1.24Q quaternary layers 107 provide barrier regions of higher bandgap energy between the quantum well layers 106. Optical emissions are generated within this quantum well active region 103. A second 1.15Q guiding layer 108b is grown on top of the last quaternary layer 107. Optical emission generated in the active region 103 is confined between the guiding layers 108a, 108b in order to concentrate the optical output emission from the laser device. A first InP defect layer 112 is grown above the second 1.15Q guiding layer 108b. This InP layer 112 is grown using a combination of GSMBE and an electron cyclotron resonance (ECR) Helium-Plasma source. During growth, the InP layer 112 is grown under conventional GSMBE conditions, except that the epilayers of the InP 112 are exposed to a flux of helium particles from an ECR source mounted inside the chamber. By exposing the InP layer 112 to the Helium flux, slow diffusing vacancy defects are produced in the InP layer 112. The thickness of this InP defect layer 112 can be optimized for particular device performance, but successful performance has been demonstrated for a defect layer 112 thickness of 400 Angstroms. A second InP defect layer of 1000 Angstrom thickness 102 is grown at normal temperature (NT-InP) above the first InP defect layer 112. This defect layer 102 provides fast diffusing group V interstitial type defects. On completion of the photolithographic patterning/etching and the RTA process, the defect layers 102, 112 are etched away and a thick 1 $\mu$m layer of InP 114 is grown in its place. A 1000 Angstrom InGaAs contact layer 105 is grown over the 1 $\mu$m InP layer 114, wherein the InGaAs layer 105 is a contact layer for applying current to the device. The 1 $\mu$m layer of InP 114 is normally etched into a ridge structure for confining and guiding the applied device current from the InGaAs contact layer 105 to a narrow region of the quantum well active region 103. The 1 $\mu$m InP layer 114 and the InGaAs contact layer 105 are grown after the RTA process, once the quantum well active region structure 103 has been grown. All layers with the exception of the InP defect layers 102, 112 are typically used in optoelectronic device fabrication. In accordance with this aspect of the present invention, the InGaAs etch stop layer previously shown in FIG. 1 is not grown over the quantum well active region 103 where quantum well intermixing occurs. This is due to the InGaAs etch stop layer obstructing the diffusion of the defects into the quantum well active region 103.

Once quantum well intermixing is induced by the rapid thermal anneal (RTA) process, the defect types in both the first and second InP defect layers 112, 102 diffuse into the quantum well active region. The slow diffusing vacancy defects in the first InP layer 112 diffuse into the quantum well active region 103, providing deep states that quench the photoluminescence and reduce carrier lifetime within the bandgap. The deep states are intermediate energy levels created within the bandgap of the quantum well active region 103. These intermediate states suppress radiative transitions within the quantum well active region 103, by providing an additional carrier transition step during conduction band to valence band carrier recombination. Also, the short transition times of carriers between the valence band and intermediate deep state levels decreases the carrier lifetime. The fast diffusing group V interstitial type defects in the second InP layer 102 diffuse into the quantum well active region 103, generating a bandgap wavelength blue shift. This causes the quantum well active region 103 to become transparent, permitting incident photons to pass through this region without being absorbed.

The thickness of the first InP defect layer 112 has to be sufficient to supply enough deep states to the quantum well active region 103 whilst allowing enough interstitial defects from the second InP layer 102 to reach the active region 103. The physical order of the defect layers must also be maintained during GSMBE growth such that the second InP defect layer 102 is grown over the first InP defect layer 112. This is to ensure that the slow diffusing vacancy type defects in the first InP layer 112, diffuse far enough into the quantum well active region to produce the deep states. Once the RTA process is complete, the defect layers 102, 112 are etched away, and current guiding and contact layers 114, 105 are grown for applying electrical current to the device.

Figure 5B:
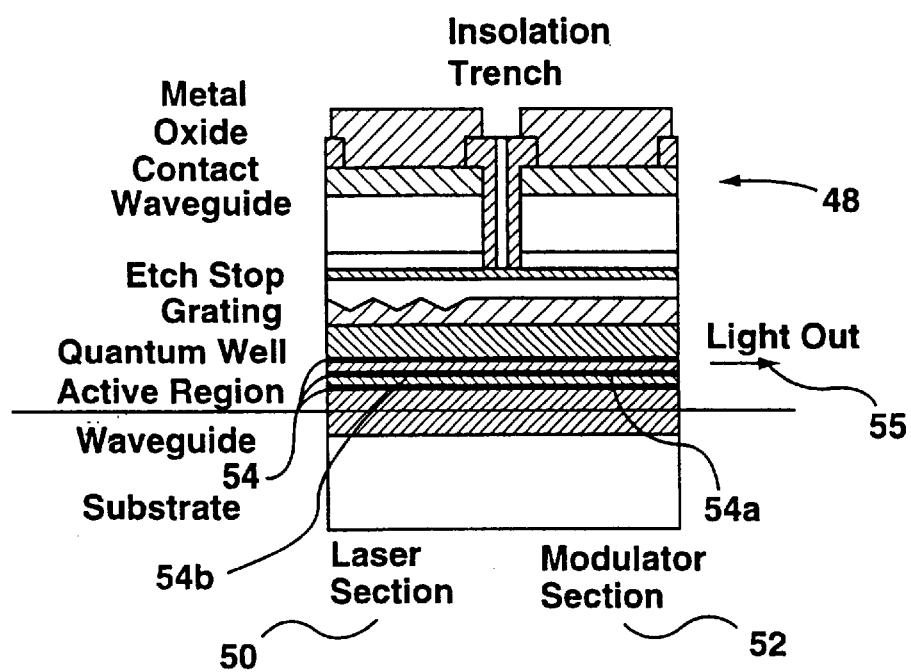
FIG. 5b shows a schematic representation of an integrated DFB laser/electro-absorption modulator device.

The principal advantage of this aspect of the present invention is identified in fabricating integrated optoelectronic devices, particularly devices comprising an integrated DFB laser and electro-absorption modulator. FIG. 5b shows a schematic representation of a fabricated integrated DFB laser/electro-absorption modulator device 48. Quantum well intermixing using slow diffusing vacancy defects and fast diffusing interstitial defects is applied to the modulator section 52 quantum well active region 54a. Firstly, this results in a bandgap blue shift in the modulator section 52 active region 54a causing the modulator region to be transparent at zero bias. This increases the efficiency of the integrated device 48 due to the optical output signal from the laser passing through the modulator active region 54a without being absorbed. Second, the existence of deep states within the bandgap of the modulator section 52 active region 54a, quenches photoluminescence and reduces the carrier lifetime. This causes the modulator 52 to operate at ultra high-speed switching times. By applying a reverse bias voltage to the modulator section 52, the bandgap of the modulator active region 54a decreases, causing absorption of the optical signal coupled from the DFB laser section 50. By removing the reverse bias voltage, the bandgap of the modulator active region 54a increases back to its original state and the modulator active region is back at transparency. The switching from absorption state back to transparency occurs at high speed. This is due to the ultra fast transition of carriers between the valence band and deep states in the bandgap of the modulator active region 54a. Consequently, the optical signal, as indicated at 55, output from the modulator 52 can be modulated at ultra-high speeds by application of a high speed reverse bias voltage.

Figure 6:
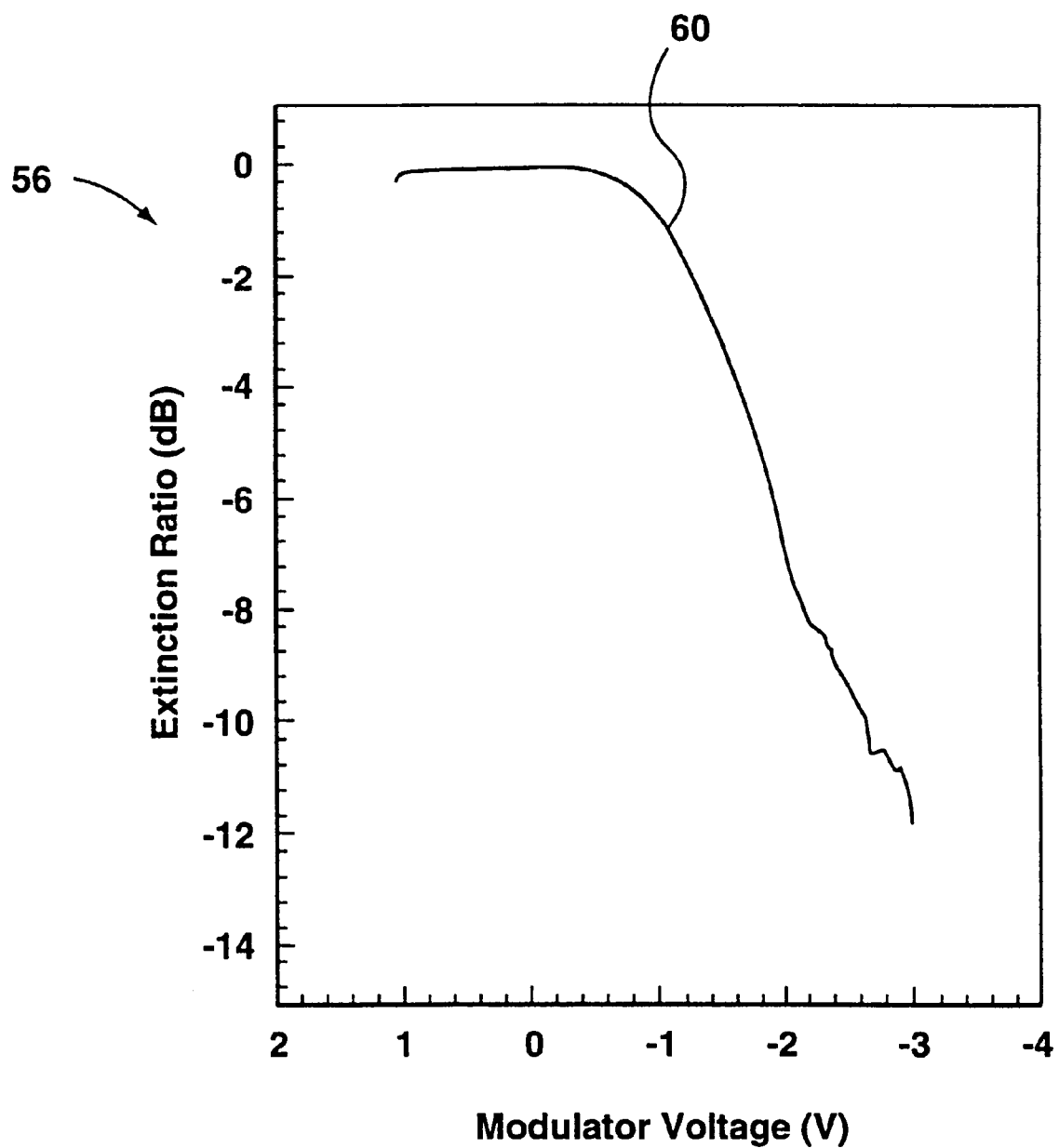
FIG. 6 shows an experimental graph of the extinction ratio between switching the modulator between the transparency and absorption state.

FIG. 6 shows an experimental graph 56 of the extinction ratio between switching the modulator between the transparency (zero bias) and absorption (reverse bias) state. The graph 56 shows an 11.8 dB reduction in optical signal intensity, as indicated at 60, when the reverse bias voltage is applied. It is to be noted that the device has not yet been optimised to give better extinction ratios, and it is believed that extinction ratios significantly better that 11.8 dB should be achievable.

The novel quantum well intermixing process provides a method of regionally modifying the bandgap properties of InGaAsP quantum well structures grown on an Indium Phosphide substrate. This technique is particularly applicable to 1.3 $\mu$m and 1.55 $\mu$m integrated optoelectronic devices, where selected regions of the quantum well structure may require bandgap blue shifting and/or deep states for reducing carrier lifetime. Furthermore, the technique produces bandgap modifications to selected components (e.g. modulator) of an integrated device without introducing unwanted affects to neighbouring component(s) (e.g. DFB laser). Using this novel quantum well intermixing technique, the modulator section of an integrated DFB laser/electro-absorption modulator device exhibits fast switching times with efficient optical coupling between the DFB laser and modulator region. This method of bandgap engineering enables the fabrication of efficient and compact high speed integrated optoelectronic devices suitable for 1.3 $\mu$m and 1.55 $\mu$m telecommunication applications. The 1.55 $\mu$m operating wavelength region is considered a global standard for leading edge long haul fibre optic communication system. Consequently, the described QWI method is potentially suited for developing future high speed optoelectronic devices.

It should also be mentioned that whilst this alternative aspect of the present invention, where a Helium-Plasma stream provides vacancy defects is related to methods for fabricating Indium Phosphide based optoelectronic devices, it may also be applicable to GaAs based devices, although this has not been performed experimentally.

We claim:

1. A device for generating a high speed modulated optical signal comprising:

A laser and an electro-absorption modulator integrated within the device, wherein said electro-absorption modulator comprises an Indium Gallium Arsenide Phosphide (InGaAsP) quantum well active region with modified effective bandgap properties, where said modified effective bandgap properties in the electro-absorption modulator quantum well active region comprises:
   (a) Deep states that reduce carrier lifetimes and quench photoluminescence within said bandgap, where said deep states, provides non-radiative defect centers within said quantum well active region bandgap of said electro-absorption modulator; and
   (b) An effective bandgap energy increase (Blue Shift) of said quantum well active region.

2. The device as defined in claim 1, wherein the modified effective bandgap properties in the electro-absorption modulator quantum well active region comprises:
   (a) deep states that reduce carrier lifetimes and quench photoluminescence within said bandgap; and
   (b) an effective bandgap energy increase (Blue Shift) of said quantum well active region.

3. The device defined in claim 2, wherein said deep states, provides non-radiative defect centres within the quantum well active region bandgap of the electro-absorption modulator.

4. The device defined in claim 3, wherein said non-radiative defect centres generate short carrier recombination times within the quantum well active region bandgap of the electro-absorption modulator, thereby causing the electro-absorption modulator to exhibit ultra high-speed response.

5. The device defined in claim 2, wherein said effective bandgap energy increase (Blue Shift) of said quantum well active region, causes transparency of the electro-absorption modulator under zero bias conditions.

6. The device defined in claim 1, wherein the quantum well active region comprises a plurality of quantum well layers separated by layers providing barrier regions.

7. The device defined in claim 6, wherein the layers providing barrier regions are quaternary layers.

8. The device defined in claim 7, wherein the quaternary layers are 1.24Q quaternary layers.

9. An optoelectronic device comprising:
   a substrate; and
   a indium gallium arsenide phosphide (InGaAsP) quantum well active region on the substrate, the quantum well active region having a bandgap and modified effective bandgap properties which comprise:
      (a) deep states which reduce carrier lifetimes and quench photoluminescence within the bandgap; and
      (b) an effective bandgap energy increase (blue shift) of the quantum well active region.

10. The optoelectronic device defined in claim 9, wherein the deep states provide non-radiative defect centers within the bandgap.

11. The optoelectronic device defined in claim 10, wherein the non-radiative defect centers generate short carrier recombination times within the bandgap, thereby causing the optoelectronic device to exhibit ultra-high-speed response.

12. The optoelectronic device defined in claim 9, wherein the effective bandgap energy increase (blue shift) causes transparency of the quantum well active region under zero bias conditions.

13. The optoelectronic device defined in claim 9, wherein the quantum well active region comprises a plurality of quantum well layers separated by layers providing barrier regions.

14. The optoelectronic device defined in claim 13, wherein the layers providing barrier regions are quaternary layers.

15. The optoelectronic device defined in claim 14, wherein the quaternary layers are 1.24Q quaternary layers.

16. The optoelectronic device defined in claim 9, wherein the quantum well active region comprises a modulator section.

17. The optoelectronic device defined in claim 9, wherein the quantum well active region comprises a laser section.

* * * * *